United States Patent [19]

O'Connor

[11] Patent Number: 5,306,922
[45] Date of Patent: Apr. 26, 1994

[54] PRODUCTION OF HIGH BEAM CURRENTS AT LOW ENERGIES FOR USE IN ION IMPLANTATION SYSTEMS

[75] Inventor: John P. O'Connor, Andover, Mass.

[73] Assignee: Genus, Inc., Sunnyvale, Calif.

[21] Appl. No.: 33,286

[22] Filed: Mar. 16, 1993

[51] Int. Cl.⁵ .......................................... H01J 37/317
[52] U.S. Cl. .................................. 250/492.21; 250/398
[58] Field of Search ............ 250/492.21, 492.3, 492.2, 250/398

[56] References Cited

U.S. PATENT DOCUMENTS 4,037,100  7/1977  Purser ................................. 250/282
4,209,704  6/1980  Krimmel ......................... 250/492.21
5,216,253  6/1993  Koike ............................. 250/492.21

FOREIGN PATENT DOCUMENTS 4-51446  2/1992  Japan ............................. 250/492.21

*Primary Examiner*—Jack I. Berman
*Attorney, Agent, or Firm*—Nields & Lemack

[57] ABSTRACT

As geometries of semiconductor devices shrink in size and the number of circuits per unit area increase, a number of the ion implants required to fabricate these devices will use very low energies (as low as 2 keV). In the present invention, a technique is utilized that generates substantial beam currents at low energies utilizing ion sources that are standard in the industry. Molecular ions are extracted from the plasma of the ion source at voltages numerically higher than the desired electron voltage at which the desired atomic ions are to strike the target, and are then dissociated into components which include the desired atomic ions moving with an energy which is a fraction of that at which the molecular ions were extracted.

5 Claims, 4 Drawing Sheets

PRODUCTION OF HIGH BEAM CURRENTS AT LOW ENERGIES FOR USE IN ION IMPLANTATION SYSTEMS

BACKGROUND OF THE INVENTION

1. Field of the Invention

The present invention relates to the generation of low energy ion beams with particular emphasis for use in implantation of ions into semiconductor materials

2. Description of the Prior Art

The production of low energy ion beams has increased in importance in recent years, and a significant amount of effort has been expended to enhance the low energy capabilities of ion beam systems, particularly those used in ion implantation.

In FIG. 1, a generic ion beam generation system is shown where an ion beam extraction system (comprising an ion source 1 and an extraction electrode 2) is followed by a sector analyzing magnet 3 and a target 4. The principal approach to increase low energy ion beam production has been to increase the ion beam output from ion sources with low extraction voltages. To produce 10 keV $^{11}B+$ ions from a plasma operating with boron trifluoride gas ($BF_3$), the extraction supply would be set to 10 kV. Because of the space charge limit law and other limitations, this approach has achieved only moderate success to date.

An alternative approach is to extract molecular ions from the ion source and to allow these ions to impact upon a target. For example, if one desired to produce a low energy beam of boron ions, one may operate the ion source in FIG. 1 with boron trifluoride gas ($BF_3$). A substantial quantity of $BF_2+$ ions may be produced and extracted from typical ion sources such as, for example, a Freeman ion source or hot filament Penning Ion Gauge (PIG) source. This molecular ion may then be accelerated, selected by the magnet and impact into the target. Upon striking the target, the $BF_2+$ ionic molecule will dissociate into boron and fluorine atoms. These components of the molecule will have effective energies, $E_{Effective}$:

$$E_{Effective} = E_{Molecule} * (M_{Atom}/M_{Molecule}) \quad (1)$$

where $E_{Molecule}$ is the energy of the molecule $M_{Atom}$ is the mass of the atom, and $M_{Molecule}$ is the mass of the molecule.

For the boron ion derived from the $BF_2$ molecule, the boron ion will have:

$$E_{Boron} = E_{BF2} * (11/49). \quad (2)$$

Thus, to obtain a boron atom with an energy of 10 keV, the $BF_2$ molecule would be extracted at 44.55 kV. Significantly higher beam currents may be achieved at this extraction voltage than at the 10 kV extraction voltage used for direct boron extraction from the ion source.

However, a limitation of the molecular ion technique at present is that undesired atoms will impact into the target. In the example above, the fluorine atoms will become resident in the target. This contamination may be unacceptable in a number of processes.

SUMMARY OF THE INVENTION

The technique of the present invention incorporates the benefits of the molecular ion extraction technique but eliminates the contamination associated with undesired ion species by causing dissociation of the molecular ions and removal of undesired ion species prior to impact of ions on the target.

BRIEF DESCRIPTION OF THE DRAWINGS

The invention may best be understood from the following detailed description thereof, having reference to the accompanying drawings, in which.

DESCRIPTION OF THE PREFERRED EMBODIMENT

Figure 1:
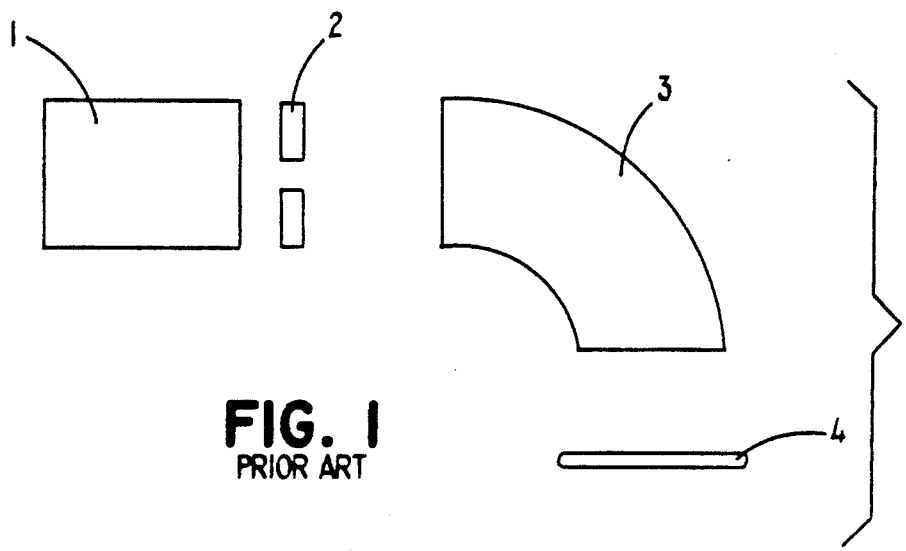
FIG. 1 is a diagrammatic sketch showing a prior-art ion beam generation system where an ion beam extraction system is followed by a sector analyzing magnet and a target.
Figure 2:
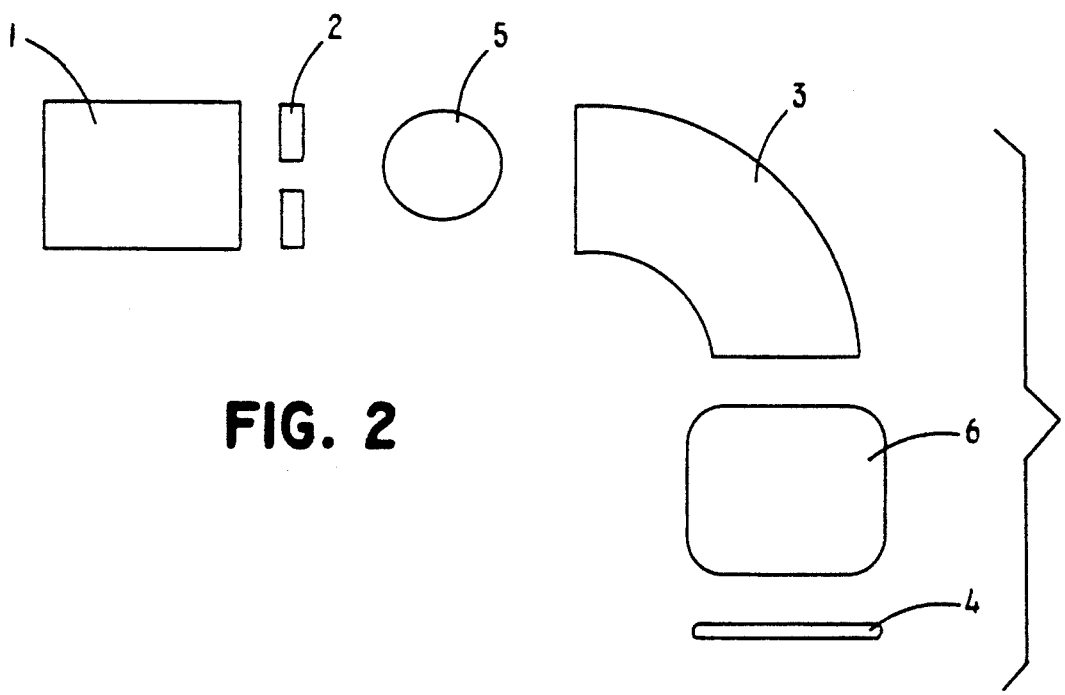
FIG. 2 is a diagrammatic sketch showing one embodiment of the invention wherein an ion beam generation system is followed by a gas cell, a sector analyzing magnet, a post-analysis acceleration system and a target.

Referring now to FIG. 2, in the embodiment of the invention therein shown an ion beam generation system comprising an ion source 1 and an extraction electrode 2 produces a beam of molecular ions which is directed through a gas cell 5 and thence to a sector analyzing magnet 3. Ions emerging from the sector analysis magnet are directed into a post-analysis acceleration system (or post-acceleration region 6) and onto a target 4. The ion source and extraction system are set up to extract molecular ions from the plasma which is produced in the ion source. In passing through the gas cell the molecular ions are dissociated into the component species of which the molecular ions are composed. These component species include atoms which are to be implanted into the target, and a fraction of these desired atoms emerge from the gas cell as ions. Of the various components emerging from the gas cell, these ions of the desired atoms are selected by the sector magnet, accelerated in the post-analysis acceleration region and impact into the target. Since the sector magnet may be set to select only those ions resulting from the dissociation of the molecular species, the presence of contaminant atoms from the molecule are eliminated.

The phenomenon of dissociation of molecular ions into atomic ions in passing through a gas cell is well known, and is disclosed, for example, in U.S. Pat. No. 4,037,100 to Kenneth H. Purser and assigned to General Ionex Corporation.

For example, if the ion source is operated with $BF_3$ gas, the system may be set to extract $BF_2+$ ions from the source with an extraction voltage of 44.55 kV. These ions pass through the gas cell where they dissociate into component atoms and atomic ions. The sector magnet is set to select only those boron ions obtained from the dissociated $BF_2+$ molecule. These boron ions will have an effective energy of 10 keV using equation (1). The post-analysis accelerator is set to 0 kV so the boron ions will impact upon the target at 10 keV. Although the post-analysis "accelerator" thus does not perform any acceleration, nevertheless the presence of this apparatus is useful in the event that the principles of the invention are not utilized, and boron ions of 100 keV are desired while only say 40 kV of extraction voltage is employed. Moreover, although a certain amount of separation of species occurs in the sector magnet, proper separation of the species is aided by the drift space which is provided by the post-analysis accelerator even when set to 0 kV.

Figure 3:
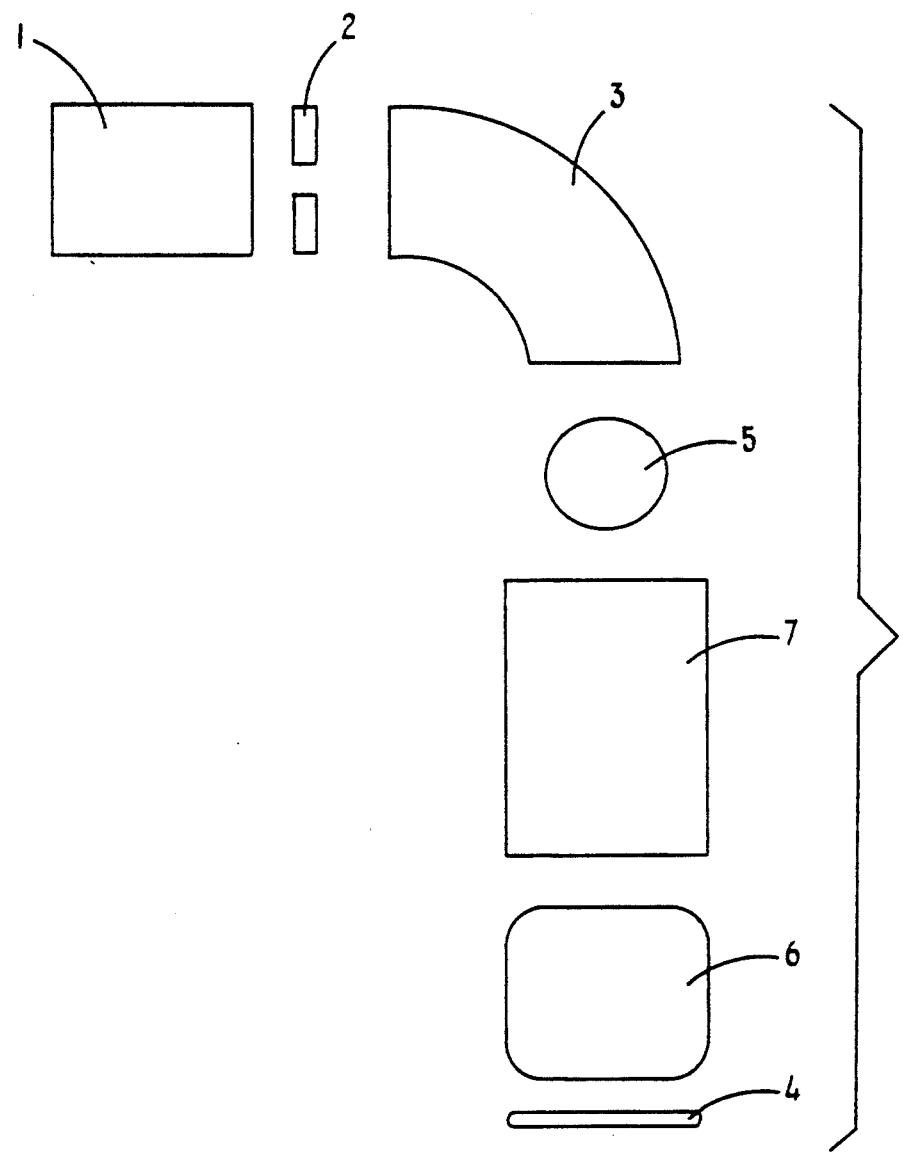
FIG. 3 is a diagrammatic sketch showing a second embodiment of the invention wherein an ion beam generation system is followed by a sector analysis magnet, a gas cell, a beam selection system, a post-acceleration region, and a target.

Referring now to FIG. 3, in the embodiment of the invention therein shown the molecular and atomic ions extracted from the ion source are analyzed in a sector analysis magnet before the desired species of molecular ion is directed through the gas cell. Here, too, some drift space is required between the sector magnet and the gas cell so that proper separation of the molecular and atomic species may be achieved. Such molecular and atomic species may include $^{10}B$, $^{11}B$, F, BF, BF2, etc. The system of FIG. 3 includes an ion beam generation system comprising an ion source and an extraction electrode followed by a sector analysis magnet, a gas cell, a beam selection system, a post-acceleration region, and a target. The sector magnet selects the desired molecular ions, and upon exit from the magnet the ions pass through the gas cell and dissociate. The atomic ions emerging from the gas cell pass through a device which has been designated a "beam selection system". This beam selection system selects desired ions by virtue of combined electrostatic and magnetic deflection, such as a Wien filter. A Wien filter is well known in the art, and is a device which uses crossed electric and magnetic fields to separate beams of mixed energy. The electric field exerts the same force on all particles, whereas the magnetic field acts more strongly on the faster ones; it is straightforward to arrange that the wanted particles move in a straight line whereas the unwanted ones are deflected. Wien filters are described, for example, at page 69 of "The Physics of Charged-Particle Beams" by J. D. Lawson (Clarendon Press, Oxford.) Descriptions of various types of Wien filters also appear in numerous other publications and patents, such as U.S. Pat. No. 4,959,544 at column 2 line 9 et seq. and U.S. Pat. Nos. 4,962,313; 4,988,869 and 5,111,042. In addition, the post-acceleration region may (but need not) include further acceleration of the selected ions. After passing through the beam selection system and the post-accelerator, the selected atomic ions impact upon the target.

As an example, operation of the ion source with $BF_3$ gas may be considered with a goal of producing 10 keV $^{11}B+$. The extraction voltage is set to 44.55 kV. The $BF_2+$ molecular ions which are extracted from the ion source are selected by the sector magnet. Upon entering the gas cell, these ions dissociate into boron and fluorine atoms and ions. The beam selection system selects the desired boron ions which drift through the post-acceleration system (set to 0 kV) and impact upon the target. Equation (1) demonstrates that the boron ions produced in this manner have 10 keV of energy with no contamination from other species.

Figure 4:
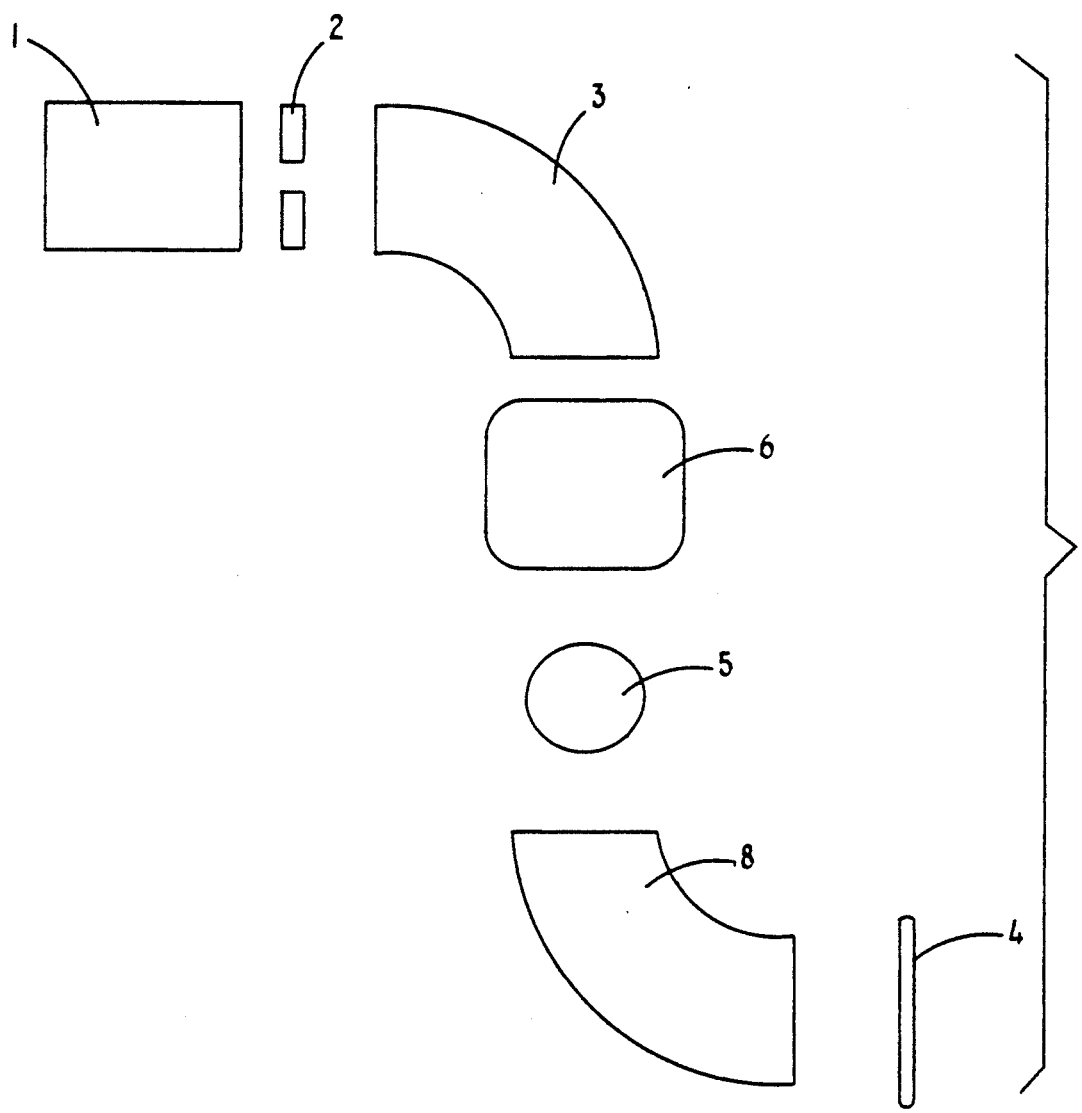
FIG. 4 is a diagrammatic sketch showing a third embodiment of the invention wherein an ion beam generation system is followed by a sector analysis magnet, a post-acceleration region, a gas cell, a second analysis magnet, and a target.

Referring now to FIG. 4, the embodiment of the invention therein shown comprehends an ion beam generation system followed by a sector analysis magnet, a post-acceleration region, a gas cell, a second analysis magnet, and a target. In this case, molecular ions are extracted from the ion source and selected by the sector analysis magnet. The ions drift through the post-acceleration region and enter the gas cell where the molecular ions dissociate into atoms and atomic ions. The desired atomic ion is selected by the second analysis magnet and impacts upon the target.

For example, to produce $^{11}B+$ ions of 10 keV, consider the ion source operation with $BF_3$ gas. The extraction voltage is set to 44.55 kV. The $BF_2+$ molecular ions which are extracted from the ion source are selected by the sector magnet. These ions drift through the post-acceleration region which is set to 0 kV. The molecular ions enter the gas cell where they dissociate into atoms and atomic ions. The second analysis magnet selects the desired boron ion which impacts into the target at 10 keV using equation (1).

Figure 5:
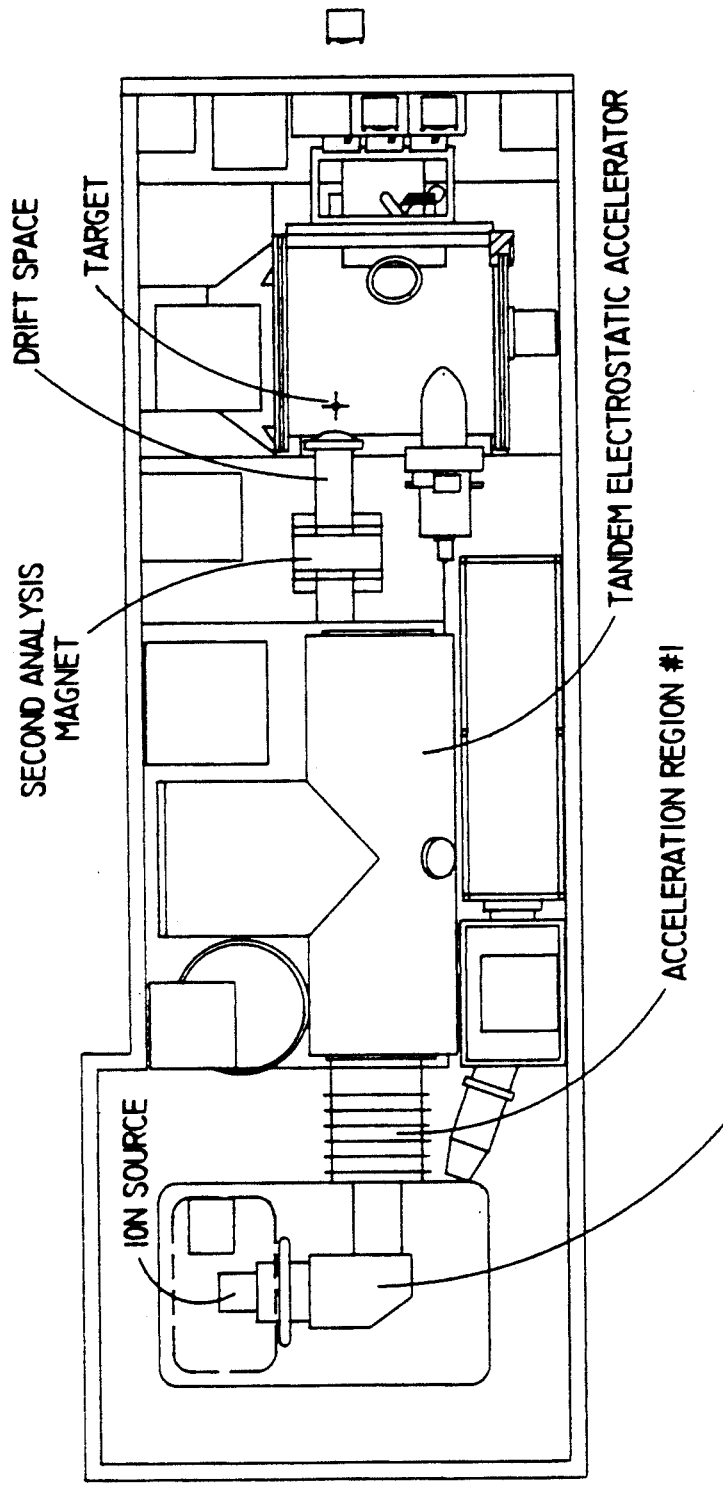
FIG. 5 is a diagrammatic sketch showing a fourth embodiment of the invention wherein an ion beam generation system is followed by a sector analysis magnet, a first acceleration region followed by a tandem accelerator, a second analysis magnet, a drift space, and a target.

The embodiment of the invention shown in FIG. 4 may be carried out by a conventional tandem accelerator, suitably modified in accordance with the teachings of co-pending application Ser. No. 958,077 filed Oct. 7, 1992 and assigned to the assignee of the present application. Such an arrangement is shown in FIG. 5. Referring thereto, the system therein shown consists of an ion beam generation system followed by a sector analysis magnet, a first acceleration region followed by a tandem electrostatic accelerator, a second analysis magnet, a drift space, and the target. In operation, the molecular ions which are extracted from the ion source are selected by the sector analysis magnet. These ions drift through the first acceleration region which is set to 0 kV. The ions next enter the tandem accelerator which is also set to 0 kV and drift to the center of the unit. At this point, the ions pass through a gas cell (typically called the stripper of the tandem accelerator) where the molecular ions dissociate into atoms and atomic ions. These atoms and ions drift out of the tandem accelerator. Upon entering the second analysis magnet, the desired atomic ions are selected. These ions then impact upon the target.

For example, to produce $^{11}B+$ ions of 10 keV, consider the ion source operation with $BF_3$ gas. The extraction voltage is set to 44.55 kV. The $BF_2+$ molecular ions which are extracted from the ion source are selected by the sector magnet. These ions drift through the first acceleration region which is set to 0 kV. The $BF_2+$ ions next enter the tandem accelerator which is also set to 0 kV and drift to the center of the unit. At this point, the ions pass through the gas cell stripper canal where the molecular ions dissociate into atoms and atomic ions. The second analysis magnet selects the desired boron ion which impacts into the target at 10 keV using equation (1).

Having thus described the principles of the invention, together with illustrative embodiments thereof, it is to be understood that although specific terms are employed, they are used in a generic and descriptive sense, and not for purposes of limitation, the scope of the invention being set forth in the following claims.

I claim:

1. Method of implanting ions of a desired element at a desired low energy into a target, comprising the following steps: (1) producing a beam of molecular ions including said desired element and having kinetic energy in excess of said desired low energy, (2) dissociating said beam into a plurality of components one of which consists of said desired element having kinetic energy no greater than said desired low energy, (3) removing components other than said desired element from said beam so as to form a beam of ions of said desired element, and (4) directing said beam of ions of said desired element into said target.

2. Method according to claim 1, comprising the following steps: (1) producing a beam of molecules each including the element to be implanted and at least one other element, (2) directing said beam through a gas cell suitable for dissociating molecules in said beam, (3) directing said dissociated beam sequentially through an analyzing magnet, a drift space and a defining aperture adapted to admit only ions of the desired element, and (4) directing said ions of the desired element onto the target.

3. Method according to claim 1, comprising the following steps: (1) producing a beam of molecules each including the element to be implanted and at least one other element, (2) directing said beam sequentially through an analyzing magnet, a drift space and a defining aperture adapted to admit only molecular ions which include the desired element, (3) directing said analyzed beam through a gas cell suitable for dissociating molecules in said beam, (4) directing said dissociated beam through a beam selection system, and (5) directing said ions of the desired element onto the target.

4. Method according to claim 1, comprising the following steps: (1) producing a beam of molecules each including the element to be implanted and at least one other element, (2) directing said beam sequentially through a first analyzing magnet, drift space and defining aperture adapted to admit only molecular ions which include the desired element, (3) directing said analyzed beam through a post-acceleration region and then through a gas cell suitable for dissociating molecules in said beam, (4) directing said dissociated beam sequentially through a second analyzing magnet, drift space and defining aperture adapted to admit only ions of the desired element, and (5) directing said ions of the desired element onto the target.

5. Method according to claim 4 wherein said gas cell is the stripper of a tandem accelerator.

* * * * *